(12) United States Patent
Storasta et al.

(10) Patent No.: US 9,324,708 B2
(45) Date of Patent: Apr. 26, 2016

(54) POWER SEMICONDUCTOR DEVICE

(71) Applicant: ABB Technology AG, Zurich (CH)

(72) Inventors: Liutauras Storasta, Lenzburg (CH); Arnost Kopta, Zurich (CH); Munaf Rahimo, Uezwil (CH)

(73) Assignee: ABB Technology AG, Zurich (CH)

( * ) Notice: Subject to any disclaimer, the term of this patent is extended or adjusted under 35 U.S.C. 154(b) by 229 days.

(21) Appl. No.: 13/716,803

(22) Filed: Dec. 17, 2012

(65) Prior Publication Data

US 2013/0099279 A1    Apr. 25, 2013

Related U.S. Application Data

(63) Continuation of application No. PCT/EP2011/060089, filed on Jun. 17, 2011.

(30) Foreign Application Priority Data

Jun. 17, 2010   (EP) .................................. 10166258

(51) Int. Cl.
*H01L 27/088* (2006.01)
*H01L 29/06* (2006.01)
(Continued)

(52) U.S. Cl.
CPC .......... *H01L 27/088* (2013.01); *H01L 29/0696* (2013.01); *H01L 29/1095* (2013.01); *H01L 29/7395* (2013.01); *H01L 29/7396* (2013.01)

(58) Field of Classification Search
CPC ............ H01L 29/0696; H01L 29/1095; H01L 27/088; H01L 29/7396; H01L 29/7395
See application file for complete search history.

(56) References Cited

U.S. PATENT DOCUMENTS

| 5,360,984 | A | 11/1994 | Kirihata |
| 5,702,961 | A | 12/1997 | Park |
| 7,112,868 | B2 | 9/2006 | Willmeroth et al. |

(Continued)

FOREIGN PATENT DOCUMENTS

GB    2 261 990 A    6/1993

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) dated Jan. 3, 2013, issued in corresponding International Application No. PCT/EP2011/060089. (9 pages).

(Continued)

*Primary Examiner* — Latanya N Crawford
(74) *Attorney, Agent, or Firm* — Buchanan Ingersoll & Rooney PC

(57) ABSTRACT

An exemplary power semiconductor device with a wafer having an emitter electrode on an emitter side and a collector electrode on a collector side, an (n-) doped drift layer, an n-doped first region, a p-doped base layer, an n-doped source region, and a gate electrode, all of which being formed between the emitter and collector electrodes. The emitter electrode contacts the base layer and the source region within a contact area. An active semiconductor cell is formed within the wafer, and includes layers that lie in orthogonal projection with respect to the emitter side of the contact area of the emitter electrode. The device also includes a p-doped well, which is arranged in the same plane as the base layer, but outside the active cell. The well is electrically connected to the emitter electrode at least one of directly or via the base layer.

23 Claims, 10 Drawing Sheets

(51) Int. Cl.
*H01L 29/10* (2006.01)
*H01L 29/739* (2006.01)

(56) References Cited

U.S. PATENT DOCUMENTS

| | | | |
|---|---|---|---|
| 7,518,197 B2* | 4/2009 | Yamaguchi | 257/401 |
| 7,692,240 B2* | 4/2010 | Ishida et al. | 257/339 |
| 8,258,601 B2* | 9/2012 | Yamaguchi | 257/565 |
| 8,288,824 B2* | 10/2012 | Tsuzuki et al. | 257/368 |
| 2004/0144992 A1 | 7/2004 | Willmeroth et al. | |
| 2004/0145013 A1* | 7/2004 | Pfirsch | 257/335 |
| 2005/0045960 A1 | 3/2005 | Takahashi | |
| 2005/0073004 A1 | 4/2005 | Onda et al. | |
| 2005/0151187 A1 | 7/2005 | Wakimoto et al. | |
| 2007/0069287 A1 | 3/2007 | Takahashi | |
| 2007/0075331 A1 | 4/2007 | Wakimoto et al. | |
| 2007/0080407 A1* | 4/2007 | Kono | 257/370 |
| 2007/0108468 A1 | 5/2007 | Takahashi | |
| 2008/0087947 A1* | 4/2008 | Rahimo | 257/328 |
| 2009/0236636 A1 | 9/2009 | Hsu | |
| 2009/0289277 A1* | 11/2009 | Yamaguchi | 257/139 |
| 2010/0025820 A1* | 2/2010 | Suekawa | 257/584 |
| 2010/0151650 A1* | 6/2010 | Kopta et al. | 438/305 |
| 2011/0079819 A1* | 4/2011 | Lin et al. | 257/142 |

OTHER PUBLICATIONS

International Search Report (PCT/ISA/210) issued on Jan. 17, 2012, by the European Patent Office as the International Searching Authority for International Application No. PCT/EP2011/060089.
European Search Report issued on Nov. 2, 2010 for Application No. 10166258.3.

* cited by examiner

POWER SEMICONDUCTOR DEVICE

RELATED APPLICATIONS

This application is a continuation under 35 U.S.C. §120 of International Application PCT/EP2011/060089 filed on Jun. 17, 2011, designating the U.S. and claiming priority to European application EP 10166258.3 filed in Europe on Jun. 17, 2010, the contents of which are hereby incorporated by reference in their entireties.

FIELD

The disclosure relates to power semiconductor devices, such as a power semiconductor device with layers of different conductivity types.

BACKGROUND INFORMATION

FIG. 1 shows a reverse-conducting insulated gate bipolar transistor (RC-IGBT) with a planar gate electrode according to a known implementation. As shown in FIG. 1, the RC-IGBT includes within one wafer 10 an insulated gate bipolar transistor with a built-in freewheeling diode. Such a reverse-conducting semiconductor device 150 includes an n-type drift layer 3 with a first main side, which is the emitter side 11 of the integrated IGBT, and a second main side, which is the collector side 15 of the IGBT and which lies opposite the emitter side 11. A p-doped base layer 4 is arranged on the emitter side 11. On the base layer 4 n-doped source regions 6 with a higher doping than the drift layer 3 are arranged.

An electrically insulating layer 78 is arranged on the emitter side 11 and covers the base layer 4 and the drift layer 3 and partially covers the source regions 6. An electrically conductive planar gate electrode 7 is completely embedded in the insulating layer 78. Above the central part of the base layer 4 no source region or electrically insulating layer is arranged.

An emitter electrode 2 is arranged on this central part of the base layer 4, which also covers the insulating layer 78. The emitter electrode 2 is in direct electrical contact to the source region 6 and the base layer 4 within a contact area 22, but is electrically insulated from the planar gate electrode 7 by a further insulating layer 782.

On the collector side 15, a buffer layer 9 is arranged on the drift layer 3. On the buffer layer 9 on the side opposite the drift layer 3, a first layer 8 with alternating n-type first regions 81 and p-doped second regions 85 is arranged. The first regions 81 as well as the buffer layer 9 have a higher doping concentration than the drift layer 3.

A collector electrode 25 is arranged on the collector side 15 and it covers the first and the second regions 81, 85 and is in direct electrical contact to them.

In such a prior art reverse-conducting semiconductor device 150 a freewheeling diode is formed between the collector electrode 25, part of which forms a cathode electrode in the diode, the n-type first regions 81, which form a cathode region in the diode, the drift layer 3, part of which forms the diode drift layer, the p-type base layer 4, part of which forms an anode region in the diode and the emitter electrode 2, which forms an anode in the diode.

An insulated gate bipolar transistor (IGBT) is formed between the collector electrode 25, part of which forms the IGBT collector electrode, the p-type second regions 85, which form a collector layer in the IGBT, the drift layer 3, part of which forms the IGBT drift layer, the base layer 4, part of which forms a p-base layer in the IGBT, the source region 3, which forms a n-type IGBT source region, and the emitter electrode 2. During on-state of the IGBT an electrically conductive channel is formed between the emitter electrode 2, the source region 6 and the p-base layer 4 towards the n-drift layer 3.

In such a prior art reverse conducting (RC)-IGBT device the p-base layer 4 of the IGBT cell is utilized also as an anode of the internal diode when the device is in the diode mode. However, the p-base layer 4 is shorted to the n-source region 6 which might be connected with the drift layer 3 via the MOS channel. If the channel is open, the electron current is flowing through the channel and shorts the p-n junction between the p-base layer 4 and the drift layer 3. As a result, the p-n junction between the p-type base layer 4 and the drift layer 3 is not forward biased and hole injection is prevented. The current is maintained by the unipolar electron current flowing through the channel. The junction starts injecting eventually when the potential difference reaches the built in voltage of the junction, however, the voltage at the contacts could be much higher. When the hole injection starts, the conductivity of the drift layer 3 is modulated and the voltage drop is reduced. Therefore, depending on the gate voltage, the diode exhibits a characteristic MOS controlled negative resistance region (voltage snap-back) in the I-V characteristics. With the gate voltage above the threshold value, the snap back is the largest, while with the voltage below the threshold or negative, the channel is closed and the snap-back is absent completely.

In addition, the MOS channel is controlling the plasma concentration below the p-base layer 4 during the internal diode conduction. By applying a gate voltage above the threshold, the plasma is extracted through the induced channel, therefore reducing the plasma below the p-type base layer 4, which results in higher on-state losses compared to the situation when the gate emitter voltage is below the threshold level or negative.

In various applications gate control during the diode mode cannot be chosen freely, so the device should be able to provide good performance at positive gate voltages applied.

U.S. Pat. No. 5,702,961 shows an IGBT, which includes, in an alternating manner, base layers and p-doped anode layers, and on the collector side strictly aligned p-layers in the projection to the anode layers and n-doped layers in the projection to the base layers. This alternating arrangement, however, negatively influences the IGBT performance.

US 2005/0073004 A1 describes a prior art MOSFET device having a highly p-doped guard ring termination on the periphery of the device.

US 2005/045960 A1 describes a reverse conducting IGBT having trench gate electrodes. Two trench gates form an IGBT active cell. Between two such active cells, an anode layer is arranged, which is less p-doped and less deep than the base layer. This device also suffers from the p-layers being arranged in the same direction as the base layers (in a line with the base layers) and from the large contact area of the anode layer to the emitter electrode, from which high IGBT on-state losses result.

US 2007/0108468 A1 describes another reverse conducting IGBT, in which IGBT active cells alternate with areas, in which p-doped layers are arranged and wherein in the p-doped layers trenches are placed on emitter potential. The p-doped layers are widely contacted to the emitter electrode. Therefore, this device has the same disadvantages as mentioned above.

SUMMARY

An exemplary reverse conducting power semiconductor device having a wafer that includes layers of different conductivity types is disclosed, which layers are arranged between an emitter electrode on an emitter side and a collector electrode on a collector side, which is arranged opposite of the emitter side, the device comprising: a drift layer of a first conductivity type, which is arranged between the emitter side and the collector side; a first layer having a first region of the first conductivity type and higher doping concentration than the drift layer and a second region of a second conductivity type, the second region is arranged adjacent to the first region, and the first layer is arranged between the drift layer and the collector electrode; a plurality of base layers of a second conductivity type, arranged between the drift layer and the emitter electrode, wherein the base layers are in direct electrical contact to the emitter electrode; a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions; a plurality of gate electrodes, each of which are electrically insulated from the base layers, the source regions, and the drift layer by an insulating layer; an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and a well of the second conductivity type, arranged in a plane, that is parallel to the emitter side and in which plane the base layers are arranged, wherein the well has a surface area and wherein the well is arranged outside the IGBT cells and is electrically connected to the emitter electrode at least one of via one of the base layers or directly at a well contact area being at most 10% of the maximum area of the well.

BRIEF DESCRIPTION OF THE DRAWINGS

The subject matter of the disclosure will be explained in more detail in the following text with reference to the attached drawings, in which.

The reference symbols used in the figures and their meaning are summarized in the list of reference symbols. Alike or alike-functioning parts are given the same reference symbols. The described embodiments are meant as examples and shall not confine the disclosure.

DETAILED DESCRIPTION

Figure 1:
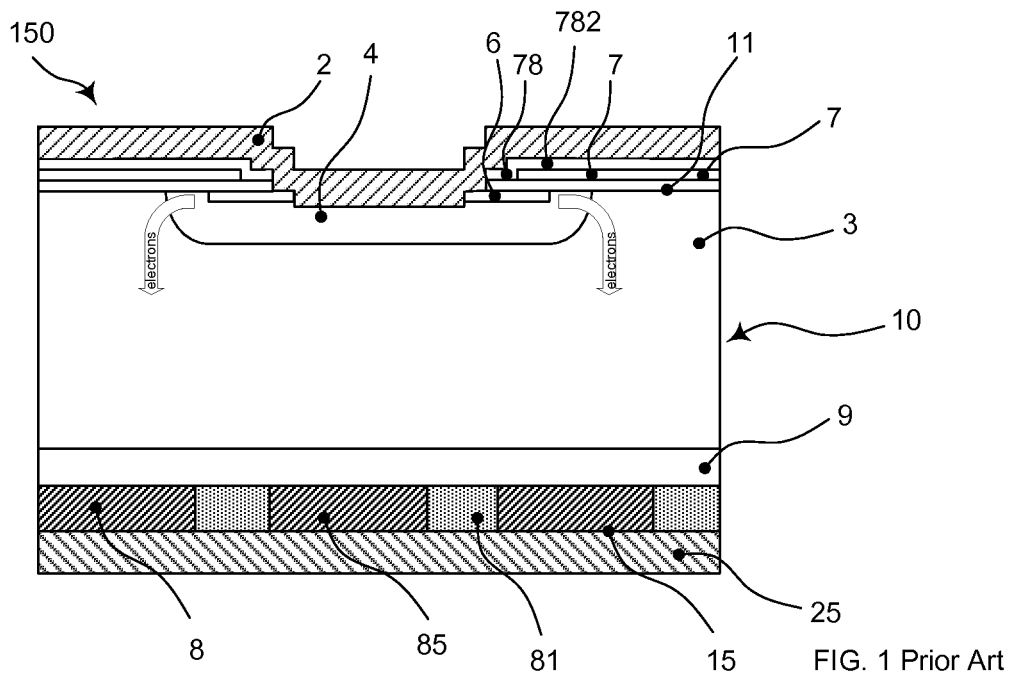
FIG. 1 shows an RC-IGBT with a planar gate electrode according to a known implementation.

Exemplary embodiments of the present disclosure provide a reverse conducting power semiconductor device with improved performance of the device in diode mode.

An exemplary power semiconductor device includes layers of different conductivity types in a wafer, which layers are arranged between an emitter electrode on an emitter side and a collector electrode on a collector side, which is arranged opposite of the emitter side.

The device includes the following layers a drift layer of a first conductivity type, which is arranged between the emitter side and the collector side, a first layer, which includes a first region of the first conductivity type and higher doping concentration than the drift layer and a second region of a second conductivity type, which is different from the first conductivity type, which second region is arranged adjacent to the first region, wherein the first layer is arranged between the drift layer and the collector electrode, a base layer of a second conductivity type, which is arranged between the drift layer and the emitter electrode, which base layer is in direct electrical contact to the emitter electrode, a source region of the first conductivity type, which is arranged at the emitter side embedded into the base layer and contacts the emitter electrode, which source region has a higher doping concentration than the drift layer, a gate electrode, which is electrically insulated from the base layer, the source region and the drift layer by an insulating layer.

The emitter electrode includes a contact area, at which the emitter electrode contacts the base layer and the source region. An active semiconductor cell (IGBT cell) is formed within the wafer, which includes layers or parts of layers, which lie in orthogonal projection with respect to the emitter side of the contact area of the emitter electrode, to which the source region is in contact, said source region, and such part of the base layer, at which an electrically conductive channel can be formed. The active IGBT area thus includes and is arranged between the orthogonal projection of these layers/ regions or part of such layer towards the collector electrode, e.g., the active area also includes part of the drift layer and the first layer.

The exemplary device can also include a well of the second conductivity type, which is arranged in the same plane as the base layer, which plane is parallel to the emitter side, wherein the well is arranged outside the active cell and is electrically connected to the emitter electrode at least one of directly or via the base layer. The contact may be made solely directly, e.g., the well touches the emitter electrode and is thus electrically directly contacted, or the well touches the base layer and is thus connected to the emitter electrode via the base layer or the well is connected to the emitter electrode directly and additionally via the base layer.

The well brings improvements in the diode mode because the influence of the MOS channel during the forward conduction of the diode is reduced and the voltage snap-back at low currents when the gate emitter voltage above the threshold on the gate is applied is also reduced. The influence of the gate control on the diode is reduced by the exemplary arrangements described herein.

By the introduction of the well, an additional diode emitter area is introduced, which is decoupled from the MOS channel. The well is placed outside of the active IGBT cell in such a way that it is not located between the cells in the PIN diode region, and therefore does not affect the performance of the device in the IGBT mode and does not influence the cell design parameters (e.g. pitch). As a result, the well does not incorporate MOS control. The well or well zones can have different doping, depth, and lifetime killing scheme from that of the base layer. The well can be designed to be partially floating (by contacting the well to emitter electrode via the base layer) or non-floating (the well directly contacting the emitter electrode) depending on the optimum injection from the additional p-well region desired.

By having a single well or well zones with a small area compared to the device area in a plane parallel to the emitter side, the performance in the IGBT mode is less influenced. In this manner, the diode performance can be optimized independently from the IGBT and the snap-back and the on-state plasma concentration controlled for optimum diode mode losses and SOA.

Figure 2:
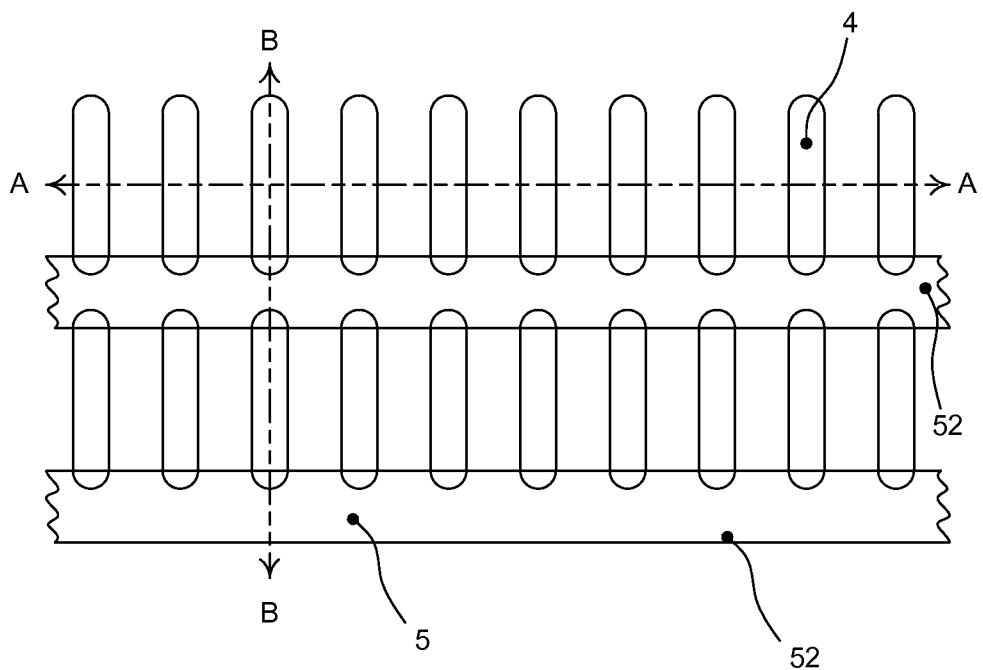
FIG. 2 shows a top view on a first exemplary arrangement of p-base layers and p-well in a plane along the line D-D of FIG. 3 in accordance with an exemplary embodiment of the present disclosure.
Figure 3:
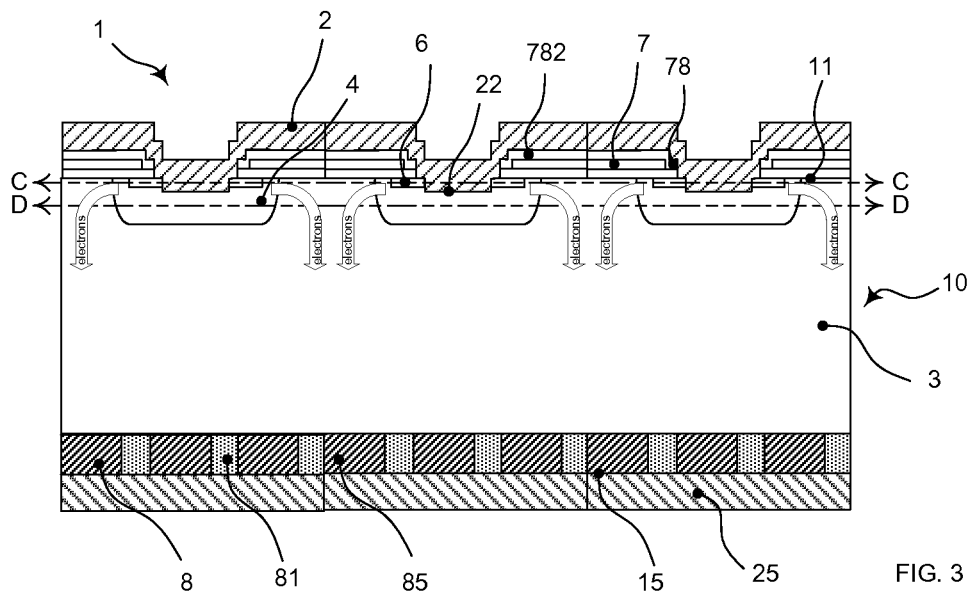
FIG. 3 shows a sectional view of an RC-IGBT with planar gate electrodes along the line A-A of FIG. 2 in accordance with an exemplary embodiment of the present disclosure.

FIG. 3 shows a sectional view of an RC-IGBT with planar gate electrodes along the line A-A of FIG. 2 in accordance with an exemplary embodiment of the present disclosure. The device includes layers of different conductivity types between an emitter electrode 2 on an emitter side 11 and a collector electrode 25 on a collector side 15, which is arranged opposite of the emitter side 11.

The device includes an (n-) doped drift layer 3, which is arranged between the emitter side 11 and the collector side 15, a first layer 8, which includes at least one n-doped first region 81 with higher doping concentration than the drift layer 3 and at least one p-doped second region 85; the first layer 8 is arranged between the drift layer 3 and the collector electrode 25, a plurality of p-doped base layers 4, which are arranged between the drift layer 3 and the emitter electrode 2, which base layers 4 are in direct electrical contact to the emitter electrode 2, a plurality of n-doped source regions 6, which are arranged at the emitter side 11 embedded into the base layer 4 and contact the emitter electrode 2, which source regions 6 have a higher doping concentration than the drift layer 3, a plurality of gate electrodes 7, each of which is electrically insulated from the base layers 4, the source regions 6 and the drift layer 3 by an insulating layer 78.

The emitter electrode 2 includes a plurality of base layer contact areas 22, at which the emitter electrode 2 contact the base layers 4 and the source regions 6.

For a reverse conducting power semiconductor device as shown in FIG. 3 the first layer 8 can also include a p-doped second region 85, which is arranged adjacent to the first region 81, thus which is arranged alternately to the first region. A plurality of such first and second regions are arranged alternately in a plane parallel to the emitter side. The device may also include more than one first and/or second regions, which are arranged alternating and abut. In an exemplary embodiment, the device includes a plurality of small second regions 85 as well as one or more large pilot second regions as disclosed in the European patent application 10157392.1, which is not published yet and which is incorporated by reference.

As shown in FIG. 3, the device includes a planar gate electrode design. The planar gate electrode 7 is arranged on top of the emitter side 11 electrically insulated from the base layer 4, the source region 6 and the drift layer 3 by an insulating layer 78. A further insulating layer 782 is arranged between the planar gate electrode 7 and the emitter electrode 2.

An active semiconductor IGBT cell 18 is formed within the wafer 10, which includes such layers or parts of such layers, which lie in orthogonal projection with respect to the emitter side 11 of one of the base layer contact areas 22 of the emitter electrode, to which one of the source region is in contact, said source region 6, and such part one of the base layers 4, at which an electrically conductive channel can be formed. The channels are indicated in the figures by the arrow marked "electrons". In the sectional view of FIG. 3, only active IGBT cells are shown (the same applies for the FIGS. 15-17). On the collector side, the IGBT cell forms a channel to the second region 85, which do not have to be aligned to the layers on the emitter side 11.

Figure 13:
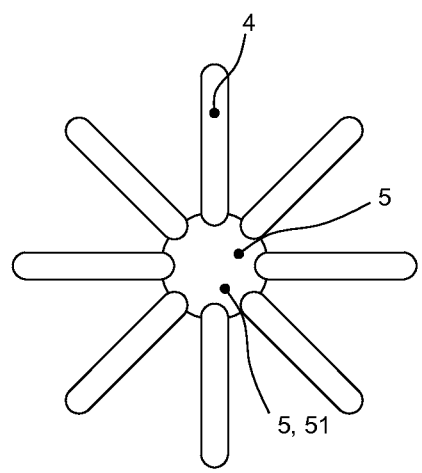

A cluster is formed by a plurality of such IGBT cells, for example, by at least 10 active cells. The cells belonging to a cluster are arranged directly adjacent to each other in one direction on the emitter side (11) and active cells are disposed at a cell pitch Direction includes a linear direction as shown in FIG. 2 (from A to A), a circular direction as shown in FIG. 13, but also any other direction in a plane parallel to the emitter side, in which the cells are directly neighboured like a sinusoidal direction. A cell pitch is the repetition distance of two neighboured cells. A cluster is formed by IGBT cells, which touch each other. The direction is meant in a plane parallel to the emitter side, and perpendicular to the sides (planes), at which two cells touch each other. The direction shall be defined through the central area of the attached sides. The semiconductor device may include a p-doped well 5 in form of a single well 51 or the device may alternatively also comprise as a plurality of well zones 52, e.g., as two or more well zones 52. If not stated otherwise in the description even if only one well is shown in a Figure, the exemplary device can also include a plurality of such wells as a continuation of the structure shown in the figure. The well has a surface area, which is the area of the well in the plane of the emitter side.

The well shall not be mixed up with p-doped layers, which are arranged on the border/periphery of the device or emitter electrode in a termination area, e.g. as a guard ring. Such highly p-doped, not electrically controllable layers are present on the border of the semiconductor device. The well(s) shall be arranged in the active area of the device, in which clusters of IGBT cells and well(s) are present and alternate/surround each other. By having clusters of the active IGBT cells, good IGBT performance of the device is ensured, whereas by the introduction of the weakly contacted wells between such clusters low on-state losses are achieved and high SOA is maintained.

The p-doped well 5 is arranged in the same plane as the base layers 4, which plane is parallel to the emitter side 11, wherein the well 5 is arranged outside the cluster of active cells 18 and is electrically connected to the emitter electrode 2. This connection may be achieved directly using part of the surface area of the well at the emitter side 11 or via the base layer 4 or both connections are realized in the same device. The contact between the well 5 and the emitter electrode 2 is achieved at a well contact area, which is at most 10% of the maximum area of the well 5. At the well an additional diode cell is thus formed, additionally to the diode cell formed from the p-doped base layer in the IGBT cell to the n-doped first region on the collector side. The diode cell forms a channel on the collector side 15 to the first regions 81, which do not have to be aligned to the layers on the emitter side 11. The well 5 is arranged in another direction than the direction, in which the plurality of active cells are arranged. It may be arranged perpendicular (aside) to the direction of the IGBT cells (e.g. aside or parallel from a row, along which IGBT cells are arranged). I an exemplary embodiment the well 5 can be arranged perpendicular to the direction, in which the active cells are arranged (but still in the same plane parallel to the emitter side).

According to an exemplary embodiment the cells can be arranged in a repetitive arrangement in a plane parallel to the emitter side (e.g. a straight line or a sinusoidal line), whereas the well or well zones are arranged not in direction of the repetitive arrangement, but e.g. parallel to the repetitive arrangement. The cells can also be arranged in a closed manner, e.g. a circular manner, whereas the well or well zones may be arranged in the center of the circle and/or around the circle of IGBT cells.

FIG. 2 shows a top view on a first exemplary arrangement of p-base layers and p-well in a plane along the line D-D of FIG. 3 in accordance with an exemplary embodiment of the present disclosure. As shown in FIG. 2, the base layers 4 are arranged in two (or more) rows (line A-A). Of course, also the arrangement of the base layers in only one row is possible. The cells are arranged as a cluster, exemplarily in a row of at least 10 cells. The base layers 4 can be designed as stripes, wherein the base layers 4 are arranged in a row in parallel along the longer sides of the stripes (FIG. 2). Stripes shall be understood as layers, which have in one direction a longer extension than in the other directions (in the following called end section). The end sections of those stripes, which are arranged in one row and which are adjusted to the same side, are in contact (touch) with a well 5, which is arranged along the end sections of the base layers 4, e.g., perpendicular to the longer sides of the base layers 4. In FIG. 2, the end sections of the base layers on the opposite side of the stripes are also in contact with another well zone 52.

Figure 4:
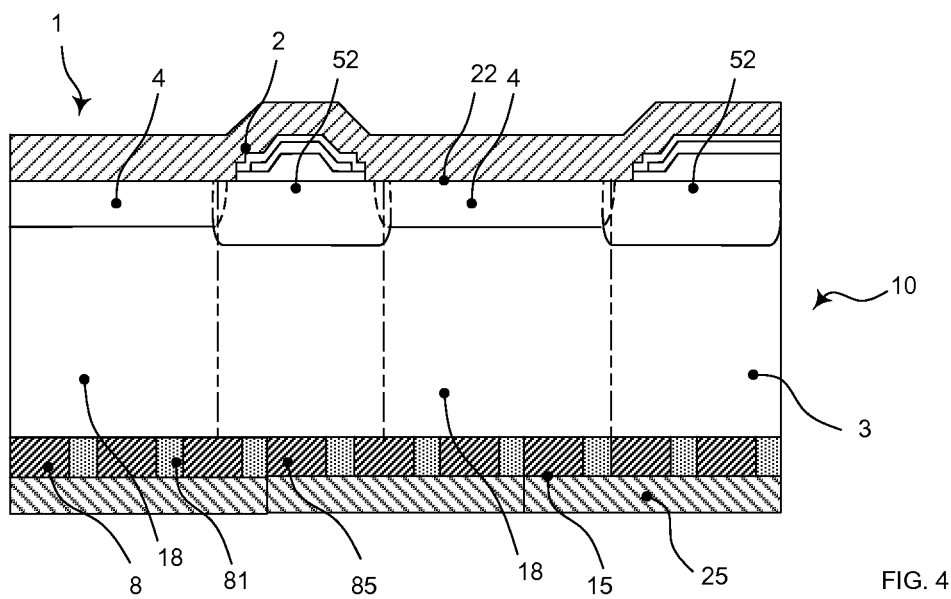
FIG. 4 shows a sectional view of an RC-IGBT along the line B-B of FIG. 2.

FIG. 3 shows a sectional view of an RC-IGBT with planar gate electrodes along the line A-A of FIG. 2 in accordance with an exemplary embodiment of the present disclosure. FIG. 4 shows a sectional view of an RC-IGBT along the line B-B of FIG. 2 As shown in FIG. 4, the base layer 4 and well 5 may abut and thereby create a contact between the well 5 and the emitter electrode 2 via the base layer 4. Furthermore in this figure, a further electrical contact of the well 5 to the emitter electrode 2 as a direct contact is shown. At such a well contact, the well 5 touches the emitter electrode 2 and is, thus, in electrical contact to it. By contacting the well 5 not on the full surface area of the well 5 as shown in FIG. 4 or through the base layer 4, the injection from the well 5 can be adjusted towards lower values. In addition, it does not interfere with the design of the IGBT front side significantly and provides more options for the designing for optimum IGBT performance.

Figure 5:
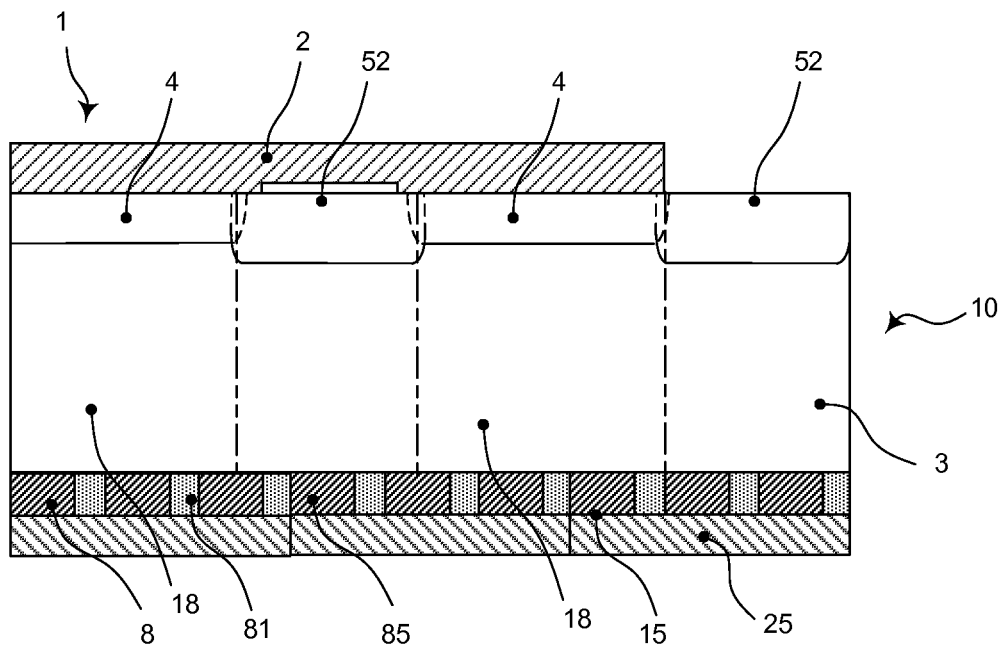
FIGS. 5 and 6 show variants of a sectional view of an RC-IGBT with planar gate electrodes along the lines B-B and A-A of FIG. 2, wherein the well is connected to the emitter electrode via the base layer in accordance with an exemplary embodiment of the present disclosure.
Figure 6:
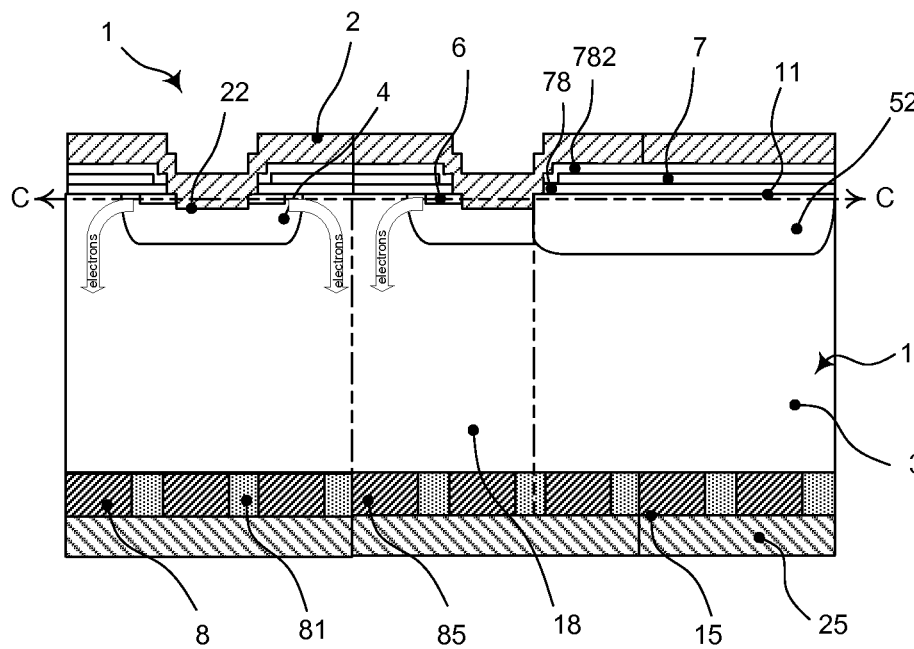

FIGS. 5 and 6 show variants of a sectional view of an RC-IGBT with planar gate electrodes along the lines B-B and A-A of FIG. 2, wherein the well is connected to the emitter electrode via the base layer in accordance with an exemplary embodiment of the present disclosure. As shown in FIG. 5, the exemplary arrangement has on the right side of the figure a well zone 52, which does not contact the emitter electrode 2 directly, but the well zone 52 abuts (touch) the base layer 4, which contacts the emitter electrode 2, e.g., the contact is partially floating.

The well zone 52 on the left side of the Figure is covered by an insulation layer in order to achieve a weak contact to the emitter electrode 2 (semi-floating).

In another exemplary embodiment no conducting channel is formed on a surface of the well layer 5. This can be achieved for a planar gate electrode design e.g. by the insulating layer 78 having such a sufficiently great thickness or the well 5 having a sufficiently high doping concentration or by a combination of both so that no electrical channel is formed.

Alternatively, the planar gate electrode (7) can be terminated at the border of the active cell 18 (as e.g. shown in FIG. 8) or no source region is present, at which a channel can be formed (FIG. 6) or there is no emitter electrode 2 present (right-hand side of FIG. 5).

Figure 7:
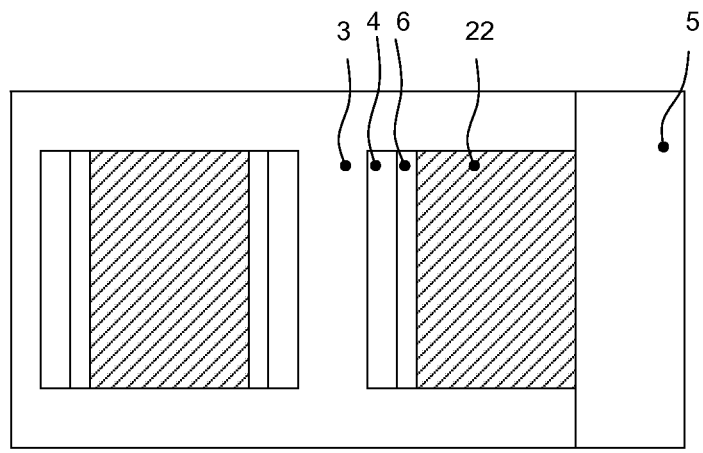
FIG. 7 shows a sectional view on the embodiment of an RC-IGBT with planar gate electrodes along the line C-C in FIG. 6 in accordance with an exemplary embodiment of the present disclosure.

FIG. 7 shows a sectional view on the embodiment of an RC-IGBT with planar gate electrodes along the line C-C in FIG. 6 in accordance with an exemplary embodiment of the present disclosure. FIG. 6 shows such an embodiment of the disclosure, in which the base layer 4 and the well 5 are arranged in contact to each other and abut, but the well 5 is insulated from the emitter electrode 2 by the insulating layer 78. The active cell 18 can be limited to that area of the wafer 10, which lies in orthogonal projection with respect to the emitter side 11 of the contact area 22 of the emitter electrode, to which the source region 6 is in contact, said source region 6, and the base layer 4 or a part of a base layer 4, at which an electrically conductive channel can be formed. That means for the device shown in FIG. 6 that the cell 18 ends at the right handed border of the contact area 22 because the contact area 22 of the emitter electrode 2 on the right side of the device is not in contact to a source region and therefore no channel is formed to the well zone 52 on the right side. The border of the active cells 18 in FIG. 6 is indicated by a dashed line.

In FIG. 6, the active cell 18 includes the base layer 4, the source region 6 and parts of the first region 81, the second region 85 and the drift layer 3. The well 5 and base layer 4, therefore, differ at least by the arrangement of the p-doped layer either within or outside the active cell 18. That means that a p-doped layer on the emitter side 11 can be unambiguously be classified as a well 5 or as a base layer 4 by its position either within the IGBT cell 18, e.g., thereby defining a base layer 4, or outside the active IGBT cell 18, e.g., thereby defining a well 5.

In the cell, the base layer 4 has a contact area, at which the base layer 4 contacts the emitter electrode 2. At this contact area, the source region 6 and the base layer 4 contact the emitter electrode 2, such that a channel is formable from the emitter electrode 2 via the source region 6 and the base layer 4 to the drift layer 3.

As shown in FIG. 6, the well 5 has a junction to the drift layer 3, which extends deeper into the wafer 10 than a junction of the base layer 4 to the drift layer 3. Alternatively, the well 5 can also have a junction of the same depth or even be shallower than the junction of the base layer 4 to the drift layer 3. Furthermore, the doping concentration doping concentration of the well 5 can also be higher, the same or lower than the doping concentration of the base layer 4. Any combination of higher/same/lower doping concentration with higher/same or shallower junction depth are of course possible.

"F" As shown in FIG. 7m the well 5 projects the side of the base layer 4, to which it is adjacent, but the well 5 can also be of the same length or shorter than the adjoined side of the base layer 4.

Figure 8:
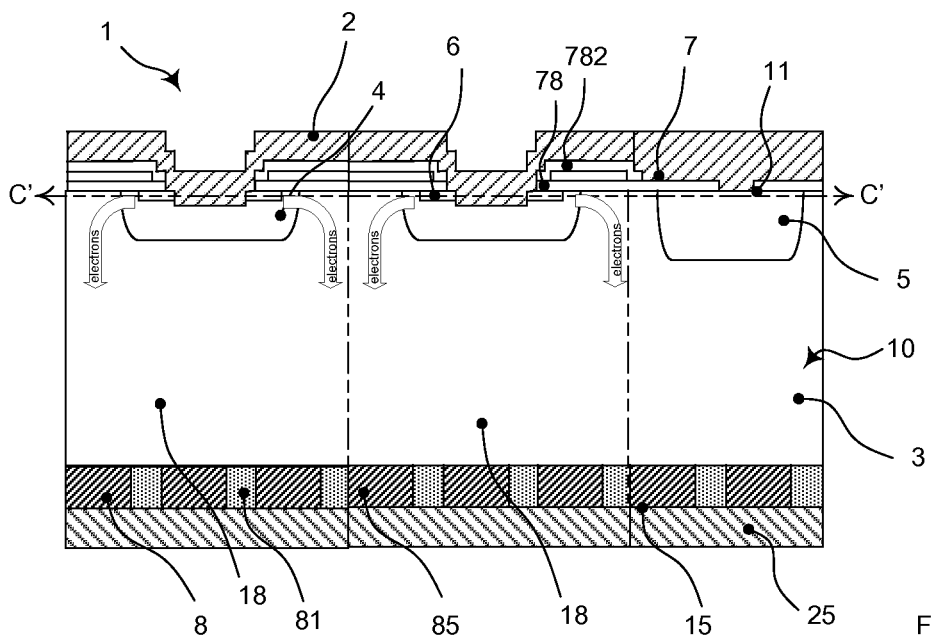
FIG. 8 shows an RC-IGBT with planar gate electrodes along the line A-A of FIG. 2, wherein the well is directly connected to the emitter electrode in accordance with an exemplary embodiment of the present disclosure.

FIG. 8 shows an RC-IGBT with planar gate electrodes along the line A-A of FIG. 2, wherein the well is directly connected to the emitter electrode in accordance with an exemplary embodiment of the present disclosure. The well contact area may be arranged at any appropriate part of the well surface, like at a central part (shown in FIG. 8) or at the border/corner of the well (FIG. 5), but of course any another position of the well contact area shall also be covered by this disclosure.

Figure 9:
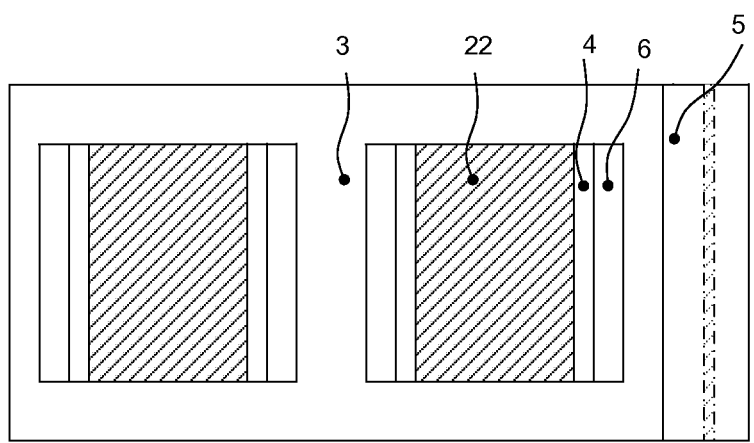
FIG. 9 shows a sectional view of an RC-IGBT with planar gate electrodes along the line C'-C' in FIG. 8 in accordance with an exemplary embodiment of the present disclosure.

FIG. 9 shows a sectional view of an RC-IGBT with planar gate electrodes along the line C'-C' in FIG. 8 in accordance with an exemplary embodiment of the present disclosure. The area, in which the well 5 contacts the emitter electrode 2, is indicated by a striped area in grey color in FIG. 9. This area is different from the base layer contact area 22 and is easily distinguishable, because no source region 6 is in contact to this grey colored striped area, in which the well 5 contacts the emitter electrode 2, e.g., at the well contact area. Therefore, no IGBT channel is formed and this area does not contribute to the active IGBT cell 18. By electrically contacting the well layer 5 directly to the emitter electrode 2 high injection from the well 5 is ensured. Additional flexibility can be achieved by adjusting the contact area between the emitter electrode 2 and the well layer 5.

Figure 10:
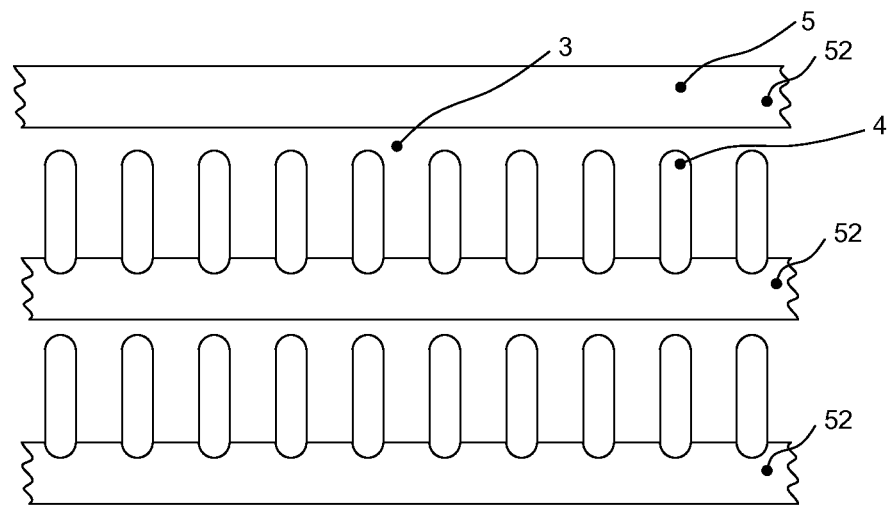
FIGS. 10-14 show top views of exemplary arrangements of p-base layers and p-wells for an RC-IGBT in a plane along the line D-D of FIG. 3 in accordance with an exemplary embodiment of the present disclosure.

FIGS. 10-14 show top views of exemplary arrangements of p-base layers and p-wells for an RC-IGBT in a plane along the line D-D of FIG. 3 in accordance with an exemplary embodiment of the present disclosure. As shown in FIG. 10, a cut in a plane corresponding to the line D-D in FIG. 3, exposes a plurality of well zones 52, which are separated from each other in the wafer by the drift layer 4. In the case shown in FIG. 10, each well zone 52 can be in contact with a plurality of base layers 4 (in FIG. 10 to the end sections at one side of the base layers formed as stripes), e.g., an electrical contact between the well zones 52 and the emitter electrode 2 is made via the base layers 4. This arrangement has an advantage of providing a good contact between the emitter electrode 2 and the well layer 5 without significant modification of the IGBT design.

In FIG. 10, the well zones 52 can be arranged in rows perpendicular to the rows, in which the cells (indicated by the base layers 4) are arranged (so that the row of the wells is arranged parallel to the direction, in which the base layers 4 area arranged). The well zones can be disposed at a distance, which corresponds to the well pitch. The well pitch is at least 3 or even 4 times higher, for example, than the cell pitch. An exemplary value of the well pitch is at least 500 µm. The pitch shall be the repetition distance of the well or cell.

Figure 11:
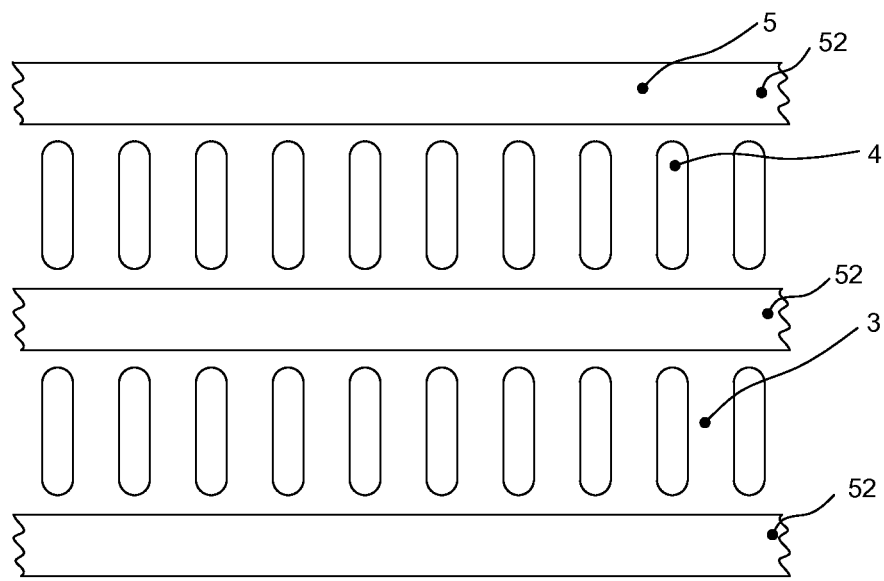

FIG. 11 shows a device, in which the well zones 52 are separated from the base layers 4 by the drift layer 3. In this case, an electrical contact of the well 52 to the emitter electrode 2 is made directly (as e.g. shown in FIG. 8).

Figure 12:
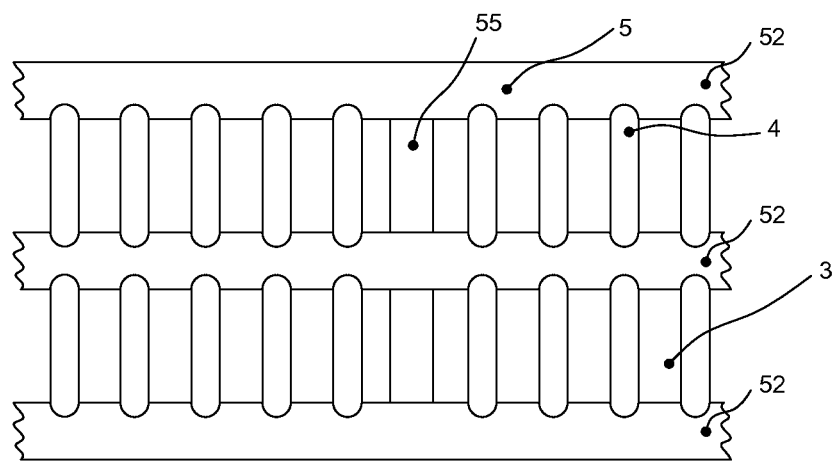

In another exemplary embodiment as shown in FIG. 12, each base layer 4 is in contact with two well zones 52, which are arranged to opposite sides of the end sections of the base layers 4, e.g., the base layers 4 are arranged between two well zones 52 and touch the well zones. Such well zones 52 may also be connected to each other via a p-doped connection well zone 55, which is a further p-doped layer in the same direction as the base layers, but not embedded with a source region, e.g., not part of an active cell and thus not part of a cluster. If the well 5 includes connection well zones 55, the electrical contact of the well 5 to the emitter electrode 2 can be made from the well zones 52 or well connection zones 55 to the emitter electrode 2. For example, in an exemplary embodiment, the connection well zones 55 can be connected to the emitter electrode 2 also via the well zones 52 (which well zones 52 can then be connected to the emitter electrode 2 directly or via the base layers 4).

Figure 14:
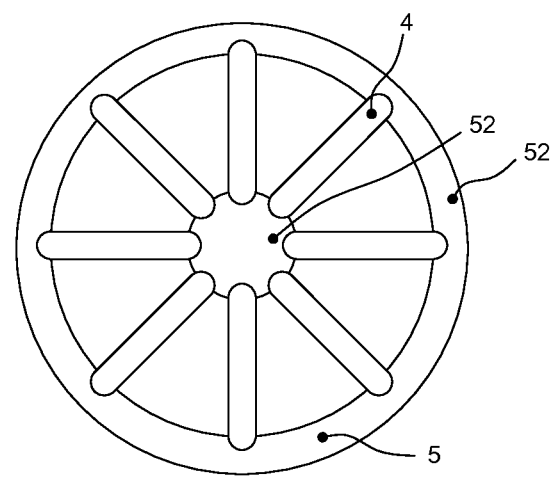

FIGS. 13 and 14 show variants, in which the base layers 4 are arranged in a circular direction as stripes spreading around a circular single well 51 or well zone 52. Further to this arrangement, FIG. 14 shows that such stripes may again be surrounded by another well zone 52 in form of a ring so that the base layers 4 in form of stripes may be connected to the inner circular well zone 52 as well as the outer ring well zone 52. For these embodiments, the cell pitch shall be understood as the minimum distance of two directly neighboured active IGBT cells, e.g., the distance of the cells at the inner well zone 52.

The plurality of base layers 4 have a base layer surface area. The base layer surface area is the area of the total surface of said base layer 4.

If a well 5 is electrically connected to the emitter electrode 2 via a base layer 4, the connection is established in a connection area. This connection area is the area, in which said well 5 (or well zone 52) adjoins the base layer 4. In another exemplary embodiment, the base layers 4 contact the well/well zones 51, 52 in a connection area, which is less than 1% said base layer surface area. If the base layer 4 contacts more than one, two well zones 52, each connection area is in an exemplary embodiment smaller than 1% respectively. If a well layer 5 is electrically connected to the emitter electrode 2 directly by placing the emitter electrode 2 on the well layer 5, the connection area can be adjusted. The emitter electrode 2 may contact the well 5 in the area which is less than 1% of said well layer surface area.

Figure 15:
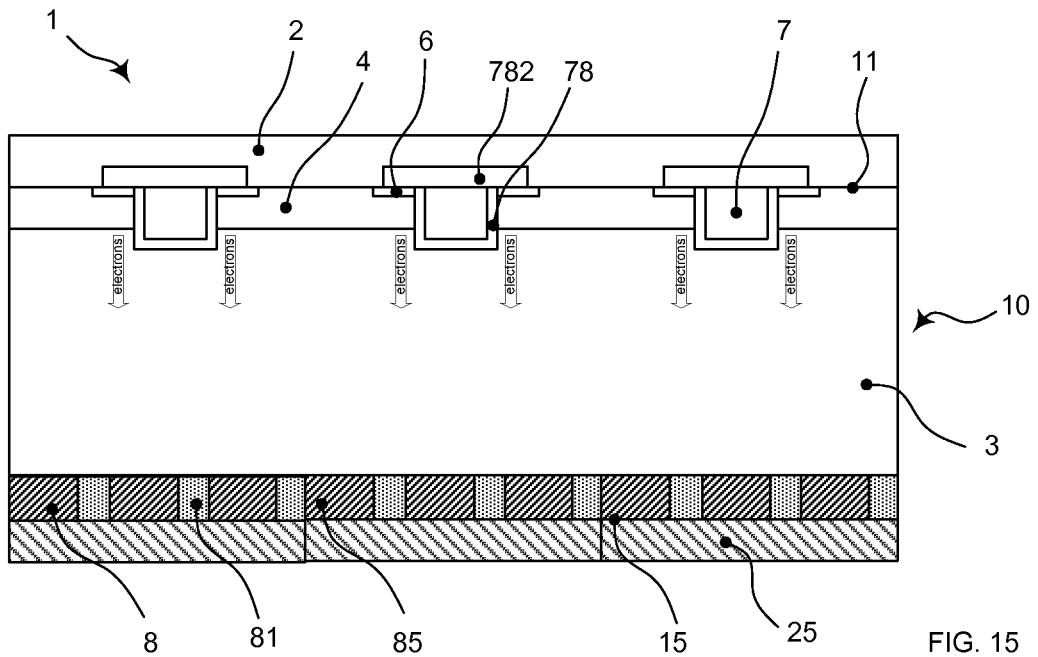
FIG. 15 shows a sectional view of an RC-IGBT with trench gate electrodes along the line A-A of FIG. 2 in accordance with an exemplary embodiment of the present disclosure.

FIG. 15 shows a sectional view of an inventive RC-IGBT with trench gate electrodes along the line A-A of FIG. 2 in accordance with an exemplary embodiment of the present disclosure. According to another exemplary embodiment the device may include trench cell designs as shown in FIG. 15, in which a trench gate electrode 75 is electrically insulated from the base layer 4, the source region 6 and the drift layer 3 by an insulating layer 78. The trench gate electrode 75 is arranged in the same plane (which plane is arranged parallel to the emitter side 11) and lateral to the base layer 4 and extends deeper into the drift layer 3 than the base layer 4. A further insulating layer 782 can be arranged between the gate electrode 7 and the emitter electrode 2.

Figure 16:
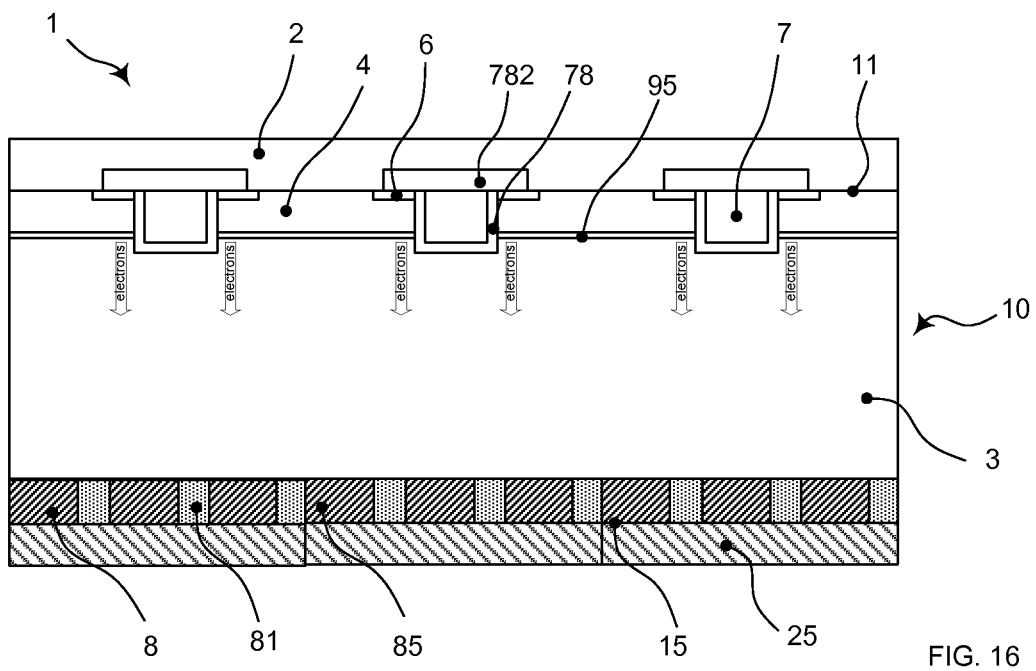
FIG. 16 shows a sectional view of an RC-IGBT with trench gate electrodes and enhancement layer along the cut A-A of FIG. 2 in accordance with an exemplary embodiment of the present disclosure.

FIG. 16 shows a sectional view of a first RC-IGBT with trench gate electrodes and enhancement layer along the cut A-A of FIG. 2 in accordance with an exemplary embodiment of the present disclosure. As shown in FIG. 16, the device can include an n-doped enhancement layer 95, which has a higher doping concentration than the drift layer 3. The enhancement layer 95 is arranged between and thereby separates the drift layer 3 and the base layer 4. The enhancement layer 95 could also be arranged between well 5 and drift layer 3. Of course, enhancement layers 95 can be applied to any sort of device, e.g., with trench and planar gate designs.

Each well/well zone 51, 52 has a well/well zone area and the drift layer 3 has a drift layer area in a plane parallel to the emitter side 11. The total maximum well area (e.g., the maximum area of all well zones in any plane parallel to the emitter side 11) may be between 0.1 to 10%, for example, of the drift layer area in said plane (which can also corresponds to the maximum device area).

Figure 17:
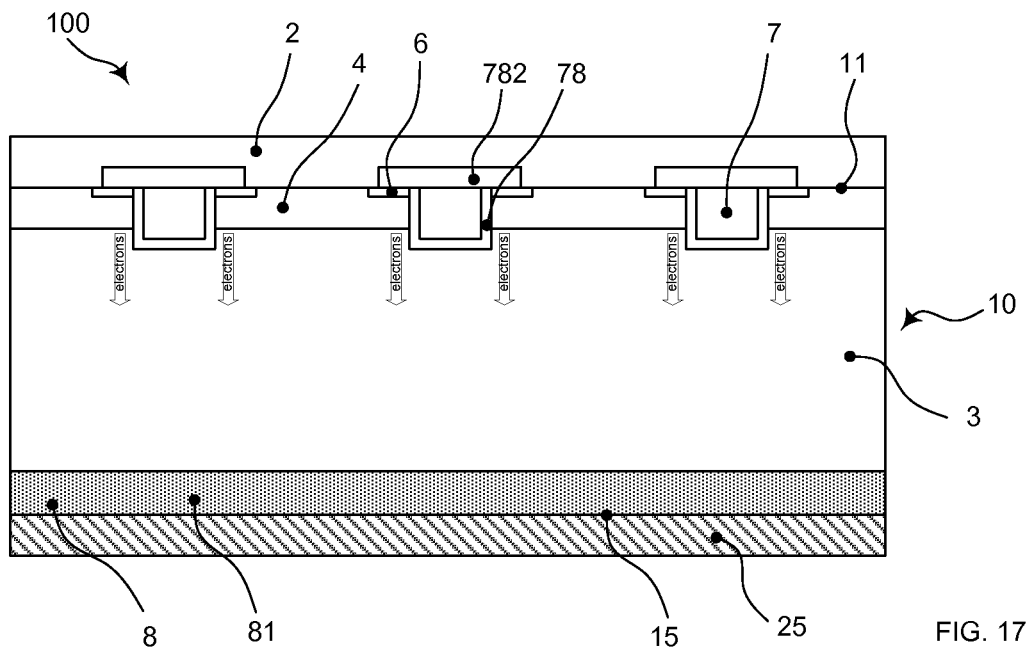
FIG. 17 shows a sectional view of a MOSFET with trench gate electrodes along the line A-A of FIG. 2 in accordance with an exemplary embodiment of the present disclosure.

In another exemplary embodiment, the well layer 5 has a junction depth between 1 to 15 μm and the doping density higher than $1*10^{16}$ atoms/cm$^3$ FIG. 17 shows a sectional view of a MOSFET with trench gate electrodes along the line A-A of FIG. 2 in accordance with an exemplary embodiment of the present disclosure.

Figure 18:
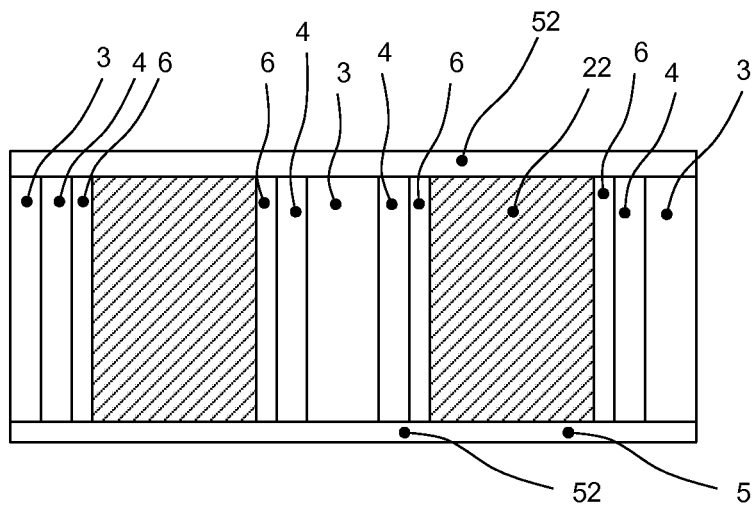
FIGS. 18-22 show top views of exemplary arrangements of the layers in a plane along the line D-D in FIG. 3 in accordance with an exemplary embodiment of the present disclosure.

FIGS. 18-22 show top views of exemplary arrangements of the layers in a plane along the line D-D in FIG. 3 in accordance with an exemplary embodiment of the present disclosure. For example, FIGS. 18 to 22 shows variants of the arrangement of a single well 51 or well zones 52 in a cut corresponding to the plane along the line C-C of FIG. 3. In FIG. 18 the source regions 6 and base layers 4 surround the contact area 22 of the emitter electrode 2 on two opposite sides in a plane parallel to the emitter side 11. Perpendicular to these sides in the same plane are the well zones 52 arranged as continuous stripes, which extend along a plurality of active cells 18. The base layer 4 and base layer contact area 22 can extend to the well zones 52 thus providing larger contact area between the well layer 5 and emitter electrode 2.

Figure 19:
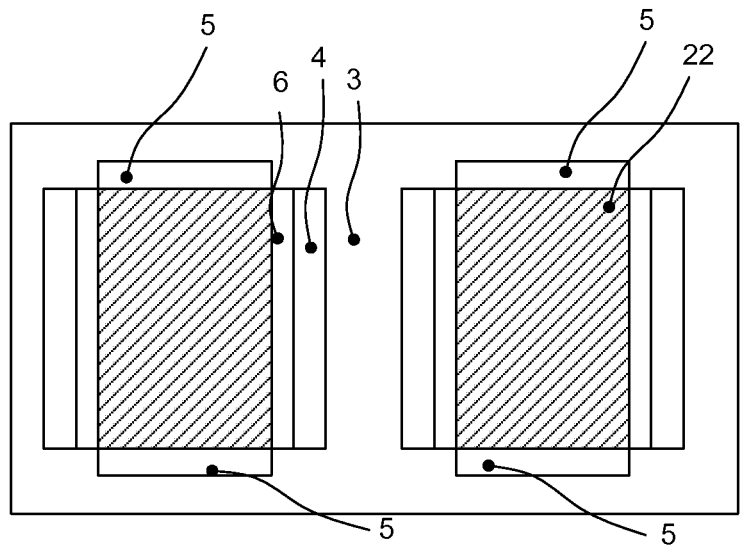

In another exemplary embodiment, as shown in FIG. 19, the well zones 52 can be arranged on the border of the active cell, but limited to the size or even be smaller than the size of the active cell 18, e.g., it abuts the border of the active cell 18. According to exemplary embodiments described herein, it can be advantageous to distribute the well zones uniformly within the device, but still to have a minimum interaction of the wells zones with the active cells during device on-state. This is the case if the distance between the well zones is larger than the ambipolar diffusion coefficient, which usually takes values between 100 and 2000 μm for example. Therefore, good performance is achieved if the well zones 52 are spaced by 100 to 2000 μm. A dimension of the single well 51 may be between 1 and 200 μm. The dimension shall be measured in a plane parallel to the emitter side 11 and perpendicular to the direction of the cluster as the maximum extension of the single well 51 in that plane.

Figure 20:
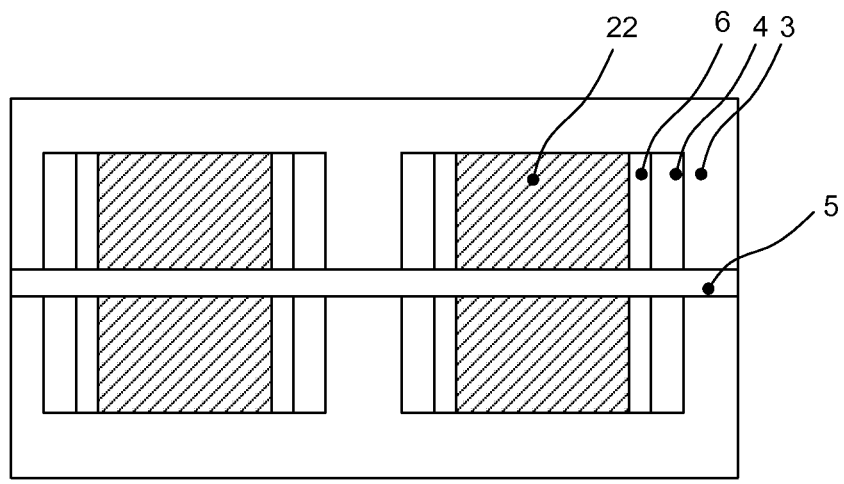
Figure 21:
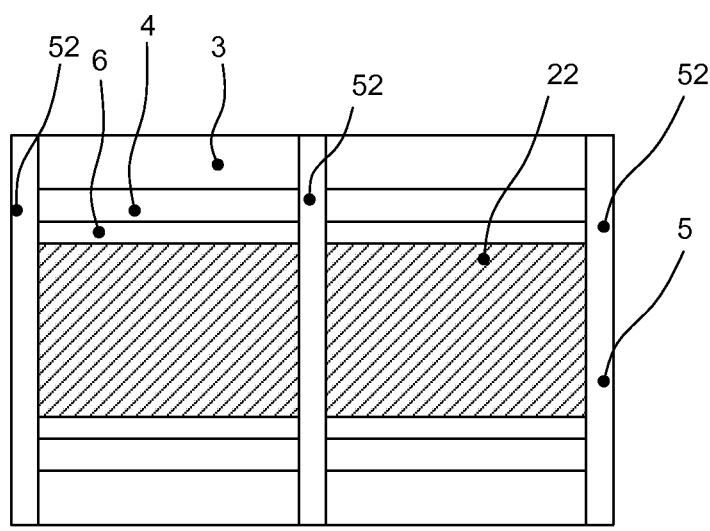

FIGS. 20 and 21 shows variants, in which the base layers 4 and well zones 52 are arranged in a similar fashion to the arrangement shown in FIG. 6. The cells 18 have source regions 6 and p-base layers 4 arranged on two opposite sides of the cells, whereas the well zones 52 are arranged in the same plane perpendicular to the source regions 6 and base layers 4. The well zones 52 may connect a plurality of such cells arranged along the well zones 52 (FIG. 20).

Figure 22:
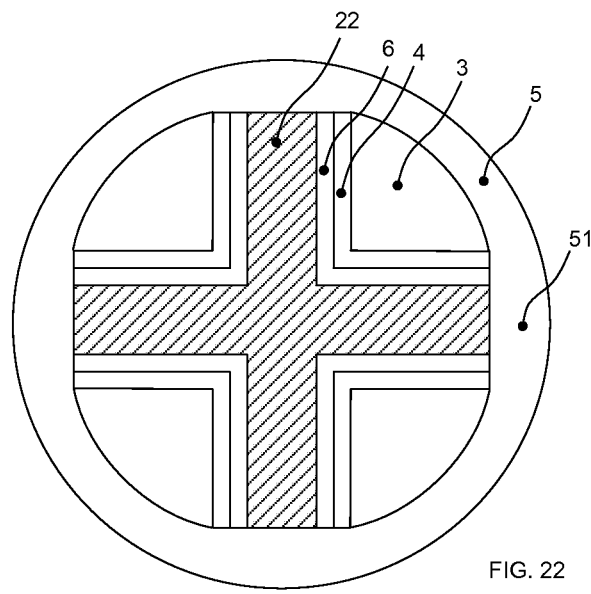

In FIG. 22, a base layer 4 in form of a cross is surrounded by a well zone 52 in form of a ring. The base layers 6 as well as source regions 6 show the same design of a cross.

Figure 23:
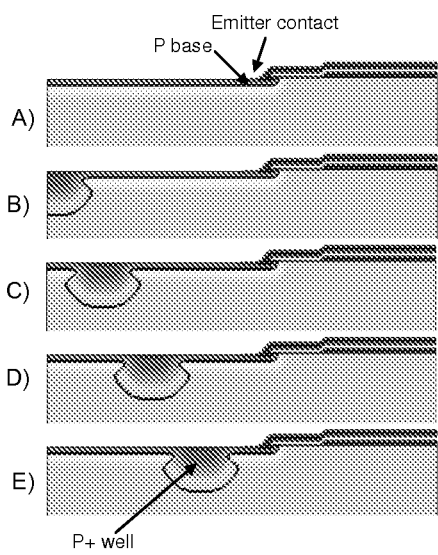
FIG. 23 shows p wells abutting the base layer with varying distance to the MOS channel within an active cell in accordance with an exemplary embodiment of the present disclosure.
Figure 24:
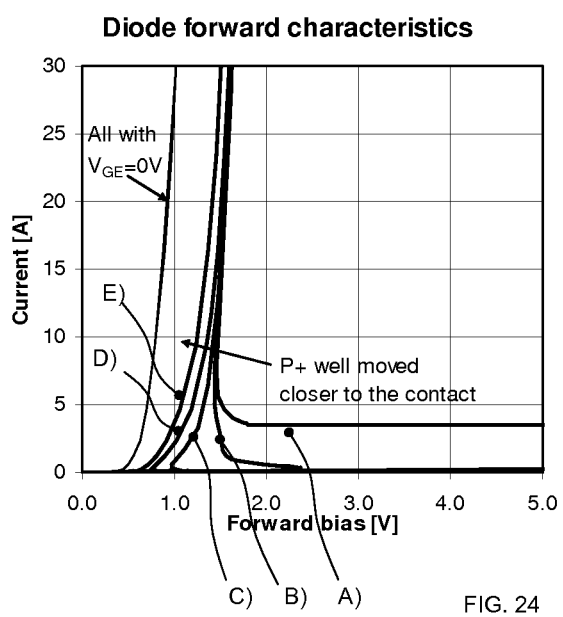
FIG. 24 shows the current versus forward bias voltage for the arrangement of FIG. 23 in accordance with an exemplary embodiment of the present disclosure.

FIG. 23 shows p wells abutting the base layer with varying distance to the MOS channel within an active cell in accordance with an exemplary embodiment of the present disclosure. FIG. 24 shows the current versus forward bias voltage for the arrangement of FIG. 23 in accordance with an exemplary embodiment of the present disclosure. In FIG. 23 another exemplary device is shown with the well 5 being connected to the base layer 4. FIG. 23 A) shows a known device without well. The closer the well 5 is arranged to the emitter electrode 2 (FIG. 23 B) to E)), the less is the influence of the channel to the diode characteristics. FIG. 24 A) shows that without p-well 5 the device shows a strong snap back effect. The snap back diminishes with the distance between the well 5 and the emitter electrode 2 getting smaller (FIG. 24 b) to E)).

The exemplary structure with well 5 outside the active cell 18 can also be applied to MOSFETs. For such MOSFETs (FIG. 17) the first layer 8 can include only the first region 81 in form of a continuous, homogeneous layer over the whole plane of the wafer 10. No p-doped second region is arranged in the plane between the drift layer and the collector electrode 25.

These exemplary embodiments described herein shall not limit the scope of the disclosure. The above mentioned designs and arrangements are just examples for any kinds of possible designs and arrangements for the base layer(s) and well (zones).

In another embodiment, the conductivity types can be switched, e.g., all layers of the first conductivity type are p-type (e.g. the drift layer 3, the source region 6) and all layers of the second conductivity type are n-type (e.g. base layer 4, the collector layer 85).

In the content of the present disclosure the term "comprising" does not exclude other elements or steps and that the indefinite article "a" or "an" does not exclude the plural. Also elements described in association with different embodiments may be combined. Moreover, reference signs in the claims shall not be construed as limiting the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Reverse conducting power semiconductor device
10 Wafer
11 Emitter side
15 Collector side
18 Active cell
100 MOSFET
150 Prior art reverse conducting power semiconductor device
2 Emitter electrode
22 Contact area
25 Collector electrode
3 Drift layer
4 Base layer
5 Well
51 Single well
52 Well zone
55 Connection well zone
6 Source region
7 Planar gate electrode
75 Trench gate electrode
78 Insulating layer
781 First insulating layer
782 Second insulating layer
8 First layer
81 First region 85 Second region
9 Buffer layer
95 Enhancement layer

What is claimed is:

1. A reverse conducting power semiconductor device having a wafer that includes layers of different conductivity types, which layers are arranged between an emitter electrode on an emitter side and a collector electrode on a collector side, which is arranged opposite of the emitter side, the device comprising:
 a drift layer of a first conductivity type, which is arranged between the emitter side and the collector side;
 a first layer having a first region of the first conductivity type and higher doping concentration than the drift layer and a second region of a second conductivity type, the second region is arranged adjacent to the first region, and the first layer is arranged between the drift layer and the collector electrode;
 a plurality of base layers of a second conductivity type, arranged between the drift layer and the emitter electrode, wherein the base layers are in direct electrical contact to the emitter electrode;
 a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions;
 a plurality of gate electrodes, each of which are electrically insulated from the base layers, the source regions, and the drift layer by an insulating layer;
 an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and
 a well of the second conductivity type, arranged in a plane, that is parallel to the emitter side and in which plane the base layers are arranged, wherein the well has a surface area and wherein the well is arranged outside the IGBT cells and is electrically connected to the emitter electrode directly via a contact of the well to the emitter electrode at a well contact area being at most 10% of the maximum area of the well.

2. The device according to claim 1, wherein the well has at least one of a junction to the drift layer, which extends deeper into the wafer than a junction of the base layer to the drift layer, and a doping concentration, which is higher than that of the base layer.

3. The device according to claim 1, wherein the well is formed as a single well or in that the well is formed as a plurality of well zones.

4. The device according to claim 3, wherein at least part or all of the well zones are connected to each other or in that the well zones are separated from each other.

5. The device according to claim 3, wherein the plurality of base layers is connected to the single well or to at least one of the well zones.

6. The device according to claim 1, wherein the IGBT cells are arranged in one direction, and in that the well is arranged perpendicular to the direction, in which the plurality of IGBT cells are arranged.

7. The device according to claim 3, wherein the wells contact the emitter electrode via the base layer and in that at least one or each base layer has a base layer surface area and in that the at least one base layer contacts the well in a contact area, which is less than 1% of said base layer surface area.

8. The device according to claim 4, wherein the well zones are arranged at a well pitch, which is at least 3 times larger than an IGBT cell pitch.

9. The device according to claim 3, wherein the IGBT cells are arranged in one direction, and in that the well is arranged perpendicular to the direction, in which the plurality of IGBT cells are arranged.

10. The device according to claim 3, wherein a maximum well area of the single well or the at least one well zones in a plane parallel to the emitter side is between 0.1% to 20% of a drift layer area in said plane.

11. The device according to claim 3, wherein the well zones are arranged at a well pitch of at least 500 µm.

12. The device according to claim 3, wherein a dimension of the single well in a plane parallel to the emitter side is between 1 and 200 µm.

13. The device according to claim 1, wherein the device comprises a plurality of planar gate electrodes, which extend to an area above the well, and in that no conductive channel is formed at the well by at least one of the insulating layer having a large thickness or the well having a high doping concentration.

14. The device according to claim 1, wherein the base layers are separated from the drift layer by an enhancement layer of the first conductivity type, which has a higher doping concentration than the drift layer.

15. The device according to claim 1, wherein the IGBT cell pitch is at most 150 µm, and at least 50 µm.

16. The device according to claim 2, wherein the device comprises a plurality of planar gate electrodes, which extend to an area above the well, and in that no conductive channel is formed at the well by at least one of the insulating layer having a large thickness or the well having a high doping concentration.

17. The device according to claim 2, wherein the base layers are separated from the drift layer by an enhancement layer of the first conductivity type, which has a higher doping concentration than the drift layer.

18. The device according to claim 3, wherein the IGBT cell pitch is at most 150 µm, and at least 50 µm.

19. A reverse conducting power semiconductor device having a wafer that includes layers of different conductivity types, which layers are arranged between an emitter electrode on an emitter side and a collector electrode on a collector side, which is arranged opposite of the emitter side, the device, comprising:
 a drift layer of a first conductivity type, which is arranged between the emitter side and the collector side;
 a first layer having a first region of the first conductivity type and higher doping concentration than the drift layer and a second region of a second conductivity type, the second region is arranged adjacent to the first region, and the first layer is arranged between the drift layer and the collector electrode;
 a plurality of base layers of a second conductivity type, arranged between the drift layer and the emitter electrode, wherein the base layers are in direct electrical contact to the emitter electrode;

a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions;

a plurality of gate electrodes, each of which are electrically insulated from the base layers, the source regions, and the drift layer by an insulating layer;

an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and a well of the second conductivity type, arranged in a plane, that is parallel to the emitter side and in which plane the base layers are arranged, wherein the well has a surface area and wherein the well is arranged outside the IGBT cells and is electrically connected to the emitter electrode directly at a well contact area being at most 10% of the maximum area of the well, wherein the wells contact the emitter electrode via the base layer and in that at least one or each base layer has a base layer surface area and in that the at least one base layer contacts the well in a contact area, which is less than 1% of said base layer surface area.

20. A reverse conducting power semiconductor device having a wafer that includes layers of different conductivity types, which layers are arranged between an emitter electrode on an emitter side and a collector electrode on a collector side, which is arranged opposite of the emitter side, the device, comprising:

a drift layer of a first conductivity type, which is arranged between the emitter side and the collector side;

a first layer having a first region of the first conductivity type and higher doping concentration than the drift layer and a second region of a second conductivity type, the second region is arranged adjacent to the first region, and the first layer is arranged between the drift layer and the collector electrode;

a plurality of base layers of a second conductivity type, arranged between the drift layer and the emitter electrode, wherein the base layers are in direct electrical contact to the emitter electrode;

a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions;

a plurality of gate electrodes, each of which are electrically insulated from the base layers, the source regions, and the drift layer by an insulating layer;

an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and a well of the second conductivity type, arranged in a plane, that is parallel to the emitter side and in which plane the base layers are arranged, wherein the well has a surface area and wherein the well is arranged outside the IGBT cells and is electrically connected to the emitter electrode directly at a well contact area being at most 10% of the maximum area of the well, wherein the well is formed as a single well or in that the well is formed as a plurality of well zones, and wherein the well zones are arranged at a well pitch, which is at least 3 times larger than an IGBT cell pitch.

21. A reverse conducting power semiconductor device having a wafer that includes layers of different conductivity types, which layers are arranged between an emitter electrode on an emitter side and a collector electrode on a collector side, which is arranged opposite of the emitter side, the device comprising:

a drift layer of a first conductivity type, which is arranged between the emitter side and the collector side;

a first layer having a first region of the first conductivity type and higher doping concentration than the drift layer and a second region of a second conductivity type, the second region is arranged adjacent to the first region, and the first layer is arranged between the drift layer and the collector electrode;

a plurality of base layers of a second conductivity type, arranged between the drift layer and the emitter electrode, wherein the base layers are in direct electrical contact to the emitter electrode;

a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions;

a plurality of gate electrodes, each of which are electrically insulated from the base layers, the source regions, and the drift layer by an insulating layer;

an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and a well of the second conductivity type, arranged in a plane, that is parallel to the emitter side and in which plane the base layers are arranged, wherein the well has a surface area and wherein the well is arranged outside the IGBT cells and is electrically connected to the emitter electrode via a contact of the well to one of the base layers.

22. A reverse conducting power semiconductor device having a wafer that includes layers of different conductivity types, which layers are arranged between an emitter electrode on an emitter side and a collector electrode on a collector side, which is arranged opposite of the emitter side, the device, comprising:

a drift layer of a first conductivity type, which is arranged between the emitter side and the collector side;

a first layer having a first region of the first conductivity type and higher doping concentration than the drift layer and a second region of a second conductivity type, the second region is arranged adjacent to the first region, and the first layer is arranged between the drift layer and the collector electrode;

a plurality of base layers of a second conductivity type, arranged between the drift layer and the emitter electrode, wherein the base layers are in direct electrical contact to the emitter electrode;

a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions;

a plurality of gate electrodes, each of which are electrically insulated from the base layers, the source regions, and the drift layer by an insulating layer;

an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and a well of the second conductivity type, arranged in a plane, that is parallel to the emitter side and in which plane the base layers are arranged, wherein the well has a surface area and wherein the well is arranged outside the IGBT cells and is electrically connected to the emitter electrode via one of the base layers, wherein the wells contact the emitter electrode via the base layer and in that at least one or each base layer has a base layer surface area and in that the at least one base layer contacts the well in a contact area, which is less than 1% of said base layer surface area.

23. A reverse conducting power semiconductor device having a wafer that includes layers of different conductivity types, which layers are arranged between an emitter electrode on an emitter side and a collector electrode on a collector side, which is arranged opposite of the emitter side, the device, comprising:

a drift layer of a first conductivity type, which is arranged between the emitter side and the collector side;

a first layer having a first region of the first conductivity type and higher doping concentration than the drift layer and a second region of a second conductivity type, the second region is arranged adjacent to the first region, and the first layer is arranged between the drift layer and the collector electrode;

a plurality of base layers of a second conductivity type, arranged between the drift layer and the emitter electrode, wherein the base layers are in direct electrical contact to the emitter electrode;

a plurality of source regions of the first conductivity type, arranged at the emitter side embedded in one of the base layers and contact the emitter electrode, wherein the source regions have a higher doping concentration than the drift layer, and the emitter electrode includes a plurality of base layer contact areas, at which the emitter electrode contacts the base layers and the source regions;

a plurality of gate electrodes, each of which are electrically insulated from the base layers, the source regions, and the drift layer by an insulating layer;

an IGBT semiconductor cell formed within the wafer, which includes such layers or parts of such layers that lie in an orthogonal projection with respect to the emitter side of one of the base layer contact areas, to which one of the source regions is in contact, said source region and such a part of one of the base layers, at which an electrically conductive channel is formed, wherein a cluster is formed by a plurality of at least 10 IGBT cells, the IGBT cells being arranged directly adjacent to each other on the emitter side; and a well of the second conductivity type, arranged in a plane, that is parallel to the emitter side and in which plane the base layers are arranged, wherein the well has a surface area and wherein the well is arranged outside the IGBT cells and is electrically connected to the emitter electrode via one of the base layers, wherein the well is formed as a single well or in that the well is formed as a plurality of well zones, and wherein the well zones are arranged at a well pitch, which is at least 3 times larger than an IGBT cell pitch.

* * * * *